United States Patent

Kawamoto et al.

[11] Patent Number: 5,846,327
[45] Date of Patent: Dec. 8, 1998

[54] SUBSTRATE SPIN TREATING APPARATUS

[75] Inventors: Takanori Kawamoto; Mitsuhiro Fujita, both of Kyoto, Japan

[73] Assignee: Dainippon Screen Mfg. Co. Ltd., Kyoto, Japan

[21] Appl. No.: 816,555

[22] Filed: Mar. 13, 1997

[30] Foreign Application Priority Data

Mar. 18, 1996 [JP] Japan ..................................... 8-090582

[51] Int. Cl.6 .............................. B05B 13/02; B08B 3/00
[52] U.S. Cl. ............................... 118/319; 118/52; 134/157
[58] Field of Search ............................ 118/52, 319, 320;
134/902, 157, 149; 15/320

[56] References Cited

U.S. PATENT DOCUMENTS 4,790,262  12/1988  Nakayama et al. ........................ 118/52

Primary Examiner—James Engel
Assistant Examiner—Calvin Padgett
Attorney, Agent, or Firm—Ostrolenk, Faber, Gerb & Soffen, LLP

[57] ABSTRACT

A substrate spin treating apparatus includes a spin chuck for supporting a substrate in a horizontal posture and spinning the substrate about a vertical axis. A nozzle is provided for supplying a treating solution to the substrate supported by the spin chuck, and a scatter preventive cup in disposed to surround the substrate on the spin chuck and has an inclined surface extending around an entire inner circumference of the cup for downwardly guiding sprays of the treating solution and the like formed by a spinning of the substrate. The scatter preventive cup includes an inner skirt extending around an entire circumference adjacent an upper end of the inclined surface The inner skirt has a surface opposed to the inclined surface and bent away from a spin center of the substrate. This construction suppresses the treating solution from adhering to and accumulating on portions, adjacent the upper end of the inclined surface, of the surface of the inner skirt opposed to the inclined surface. During cup rinsing, a rinsing solution spreads well over that surface of the inner skirt.

14 Claims, 4 Drawing Sheets

SUBSTRATE SPIN TREATING APPARATUS

BACKGROUND OF THE INVENTION

(1) Field of the Invention

This invention relates to substrate spin treating apparatus for coating, developing or otherwise treating substrates such as semiconductor wafers, glass substrates for liquid crystal displays, photomasks, or substrates for optical disks. In the substrate spin treating apparatus a treating solution such as a photoresist solution, polyimide, SOG (Spin-On-Glass) source, developer or the like is supplied to each substrate supported in a horizontal posture and spun about a vertical axis. More particularly, the invention relates to a substrate spin treating apparatus including a spin chuck for supporting a substrate in a horizontal posture and spinning the substrate about a vertical axis, a nozzle for supplying a treating solution to the substrate supported by the spin chuck, and a scatter preventive cup disposed to surround the substrate on the spin chuck and having an inclined surface extending around an entire inner circumference of the cup for downwardly guiding sprays of the treating solution and the like formed by spinning of the substrate.

(2) Description of the Related Art

As shown in FIG. 1, for example, a conventional substrate spin treating apparatus includes a spin chuck 100, a nozzle 101 and a scatter preventive cup 102.

The spin chuck 100 supports a substrate or wafer W in horizontal posture, and is rotatable with a rotary shaft 103 driven by an electric motor 104 to spin the wafer W about a vertical axis. The nozzle 101 is disposed above the wafer W supported by the spin chuck 100 to supply a treating solution to the wafer W.

The scatter preventive cup 102 is disposed around the wafer W supported by the spin chuck 100 to prevent scattering of the treating solution due to spinning of the wafer W. The scatter preventive cup 102 includes an upper cup 110, a baffle disk 120 and a lower cup 130.

The upper cup 110 has an opening 111 formed in an upper central region thereof, and an inclined surface 112 extending around an entire inner circumference thereof for downwardly guiding sprays of the treating solution and the like formed by a spin of the wafer W. Air entering through the opening 111 and flowing down around the edge of the wafer W is straightened by the baffle disk 120 and guided into the lower cup 130 to be exhausted through an exhaust duct 133 by action of an exhaust pump 134. The sprays of the treating solution and the like are entrained on the air currents to the inclined surface 112 and into the lower cup 130. The treating solution and the like collected in the scatter preventive cup 102 flow through a waste drain 131 connected to a bottom position of the lower cup 130, to be collected in a waste tank 132.

Spinning of the wafer W generates gas currents flowing from the center toward the edge of the wafer W. These gas currents collide with the inclined surface 112, and part of the gas currents then flow upward along the inclined surface 112 as indicated by an arrow UY in FIG. 1. Fine particles of the treating solution contained in the gas currents could return toward the wafer W as indicated by a two-dot-and-dash line arrow BY. To prevent the fine particles of the treating solution from re-adhering to the wafer W or exiting through the opening 111, this type of scatter preventive cup 102 (upper cup 110) has an inner skirt 113 extending around an inner circumference adjacent an upper end of the inclined surface 112 (adjacent a lower end of the opening 111).

Generally, this type of scatter preventive cup 102 includes delivery ports 140 formed adjacent the upper end of the inclined surface 112 for supplying a rinsing solution to clean the treating solution adhering to inner peripheries of the cup 102 (i.e. cup rinsing). The cup rinsing is carried out periodically with the rinsing solution.

The above conventional apparatus has the following drawbacks.

In the conventional apparatus, as shown in FIG. 2, treating solution SQ having accumulated hangs like icicles from the lower end of the inner skirt 113 of scatter preventive cup 102 (upper cup 110). The treating solution SQ hanging like icicles are obstructive to the air currents entering through the opening 111 and flowing down around the edge of the wafer W. This affects gas flow control inside the scatter preventive cup 102, resulting in an insufficient collection of the treating solution and gas exhaust, which disrupts steady substrate treatment.

The treating solution SQ hanging like icicles from the lower end of the inner skirt 113 cannot be removed by cup rinsing. The upper cup 110 must be detached from the lower cup 130 to enable manual cleaning, which is a burden on the operator. In addition, substrate treatment must be suspended while the upper cup 110 is detached and cleaned, which reduces productivity.

The inventors of the present invention have investigated the cause of the treating solution SQ hanging like icicles from the lower end of the inner skirt 113, and found the following facts.

Fine particles of the treating solution and the like contained in the gas currents indicated by arrow UY in FIG. 1 are thought to adhere to and accumulate on a surface 114 of the inner skirt 113 opposed to the inclined surface 112. The treating solution SQ having accumulated hangs like icicles from the lower end of the inner skirt 113 as shown in FIG. 2.

In the conventional apparatus, the treating solution SQ adhering to the surface 114 of the inner skirt 113 opposed to the inclined surface 112 ought to be removed by the cup rinsing carried out periodically. In practice, however, the treating solution SQ having accumulated does hang like icicles from the lower end of inner skirt 113 despite the cup rinsing carried out periodically. As a result of the investigation, it has been found that the above phenomenon occurring with the conventional cup rinsing is due to an insufficient distribution of the rinsing solution over the surface 114 of the inner skirt 113 opposed to the inclined surface 112.

When the rinsing solution is delivered in the conventional cup rinsing, the rinsing solution spreads well on the inclined surface 112, but does not spread uniformly over the surface 114 of the skirt 113 opposed thereto. The rinsing solution flows over certain portions but not the other portions of the surface 114. When cup rinsing is carried out a plurality of times, the rinsing solution delivered in the first cup rinsing flows over certain portions but not the other portions of the surface 114. In the subsequent cup rinsing, the rinsing solution tends to flow over the portions covered by the rinsing solution in the first cup rinsing. Consequently, the treating solution SQ gradually accumulates on the portions, hardly covered by the rinsing solution, of the surface 114 opposed to the inclined surface 112. The treating solution SQ having thus accumulated is believed to hang like icicles from the lower end of the inner skirt 113.

By way of solving the above problem, it is conceivable to spread the rinsing solution uniformly over the surface 114 of the inner skirt 113 opposed to the inclined surface 112 by delivering an increased quantity of rinsing solution in cup rinsing or by delivering the rinsing solution over an extended period of time. However, delivering an increased quantity of rinsing solution means an increased consumption of rinsing solution, which results in high running cost. This would also mean a wasteful use of rinsing solution since the rinsing solution would be supplied plentifully to the inclined surface 112 which in any case receives a good distribution of rinsing solution. Delivering the rinsing solution over an extended period of time also results in an increased consumption of rinsing solution, hence high running cost, and a wasteful use of rinsing solution. In addition, the cup rinsing operation takes a long time. Since cup rinsing requires a stoppage of substrate treatment, a drawn-out cup rinsing operation lowers processing efficiency to reduce productivity.

As a different way of solving the problem, additional delivery ports may be formed to deliver the rinsing solution in such directions as to improve the distribution of the rinsing solution over the surface 114 of the inner skirt 113 opposed to the inclined surface 112. However, this measure requires a complicated construction and an increased cost of the upper cup 110 to include additional rinsing solution supply piping and the like, as well as the additional rinsing solution delivery ports.

SUMMARY OF THE INVENTION

An object of the present invention is to provide a substrate spin treating apparatus having a scatter preventive cup which effectively suppresses adhesion and accumulation of a treating solution to/on a surface of an inner skirt opposed to an inclined surface, and which, during cup rinsing, facilitates distribution of a rinsing solution over the surface opposed to the inclined surface.

The above object is fulfilled, according to this invention, by a substrate spin treating apparatus for treating a substrate by supplying a treating solution to the substrate while the substrate is supported in a horizontal posture and spun about a vertical axis, the apparatus comprising a spin chuck for supporting the substrate in a horizontal posture and spinning the substrate about the vertical axis; a nozzle for supplying the treating solution to the substrate supported by the spin chuck; and a scatter preventive cup disposed to surround the substrate on the spin chuck and having an inclined surface extending around an entire inner circumference of the cup for downwardly guiding sprays of the treating solution and the like formed by a spin of the substrate; wherein the scatter preventive cup includes an inner skirt extending around an entire circumference adjacent an upper end of the inclined surface, the inner skirt having a surface opposed to the inclined surface and bent away from a spin center of the substrate.

In the above apparatus, the surface of the inner skirt opposed to the inclined surface is bent away from the spin center of the substrate. This construction provides a restricted opening to a space between the inclined surface and the surface of the inner skirt opposed thereto, and forms a pouch-like sectional shape. Thus, the construction according to this invention effectively restrains entry to that space of air currents from the center to the edge of the substrate caused by spinning the substrate and containing fine particles of the treating solution and the like. As a result, the treating solution is suppressed from adhering to and accumulating on the surface of the inner skirt opposed to the inclined surface. The above construction diminishes the possibility that the treating solution, having accumulated, hangs like icicles from the lower end of the inner skirt. The substrate treatment may be performed steadily. The operator is relieved from the burden of manually cleaning the scatter preventive cup. Productivity may be maintained at high level.

In bending the surface of the inner skirt opposed to the inclined surface away from the spin center of the substrate, it is adequate to bend only that surface away from the spin center. However, the inner skirt in its entirety may be bent away from the spin center, which will provide such an advantage as facility of manufacture.

Preferably, a turnback angle formed between a vertical line and the surface of the inner skirt opposed to the inclined surface is at least as large as an inclination angle between a vertical line and the inclined surface. This restrains, with increased assurance, the entry of air currents to the space between the inclined surface and the surface of the inner skirt opposed thereto, and hence adhesion and accumulation of the treating solution to/on that surface of the inner skirt.

The inclined surface and the surface of the inner skirt opposed thereto may define a space having a curved ceiling or a planar ceiling therebetween.

The above substrate spin treating apparatus may further comprise a rinsing solution delivery device for delivering a rinsing solution from adjacent the upper end of he inclined surface. The rinsing solution delivered from adjacent the upper end of the inclined surface will clean and remove the treating solution adhering to inner peripheries of the cup. With the surface of the inner skirt opposed to the inclined surface bent away from the spin center of the substrate, the rinsing solution delivered tends to spread uniformly even on that surface of the inner skirt. There is no need to deliver the rinsing solution in an increased quantity or over an extended time, or to provide additional delivery ports for delivering the rinsing solution in directions to promote spreading thereof over the surface of the inner skirt opposed to the inclined surface. Thus, this invention eliminates various inconveniences such as high running cost, wasteful use of the rinsing solution, low productivity and complicated construction.

The rinsing solution delivery device may include a rinsing solution source for supplying the rinsing solution, a plurality of rinsing solution delivery ports arranged adjacent the upper end of the inclined surface, and a rinsing solution supply pipe extending between the rinsing solution source and the rinsing solution delivery ports.

The scatter preventive cup may include an upper cup defining the inner skirt and the inclined surface, a lower cup having, in bottom positions thereof, an exhaust duct connected to an exhaust pump, and a waste drain connected to a waste tank, and a baffle disk for straightening gas currents flowing from the upper cup down around edges of the substrate, and guiding the gas currents into the lower cup.

The upper cup may have an opening in an upper central region thereof, the inner skirt being formed in a lower portion of the opening, and the inclined surface being continuous with the surface of the inner skirt bent away from the spin center.

The upper cup may be removably mounted on the lower cup.

The above substrate spin treating apparatus may be used to coat the substrate with a photoresist solution, polyimide or SOG (Spin-On-Glass) source supplied through the nozzle. Alternatively, the apparatus may develop the substrate with a developer supplied through the nozzle.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENT

A preferred embodiment of this invention will be described in detail hereinafter with reference to the drawings.

Figures 1, 2:
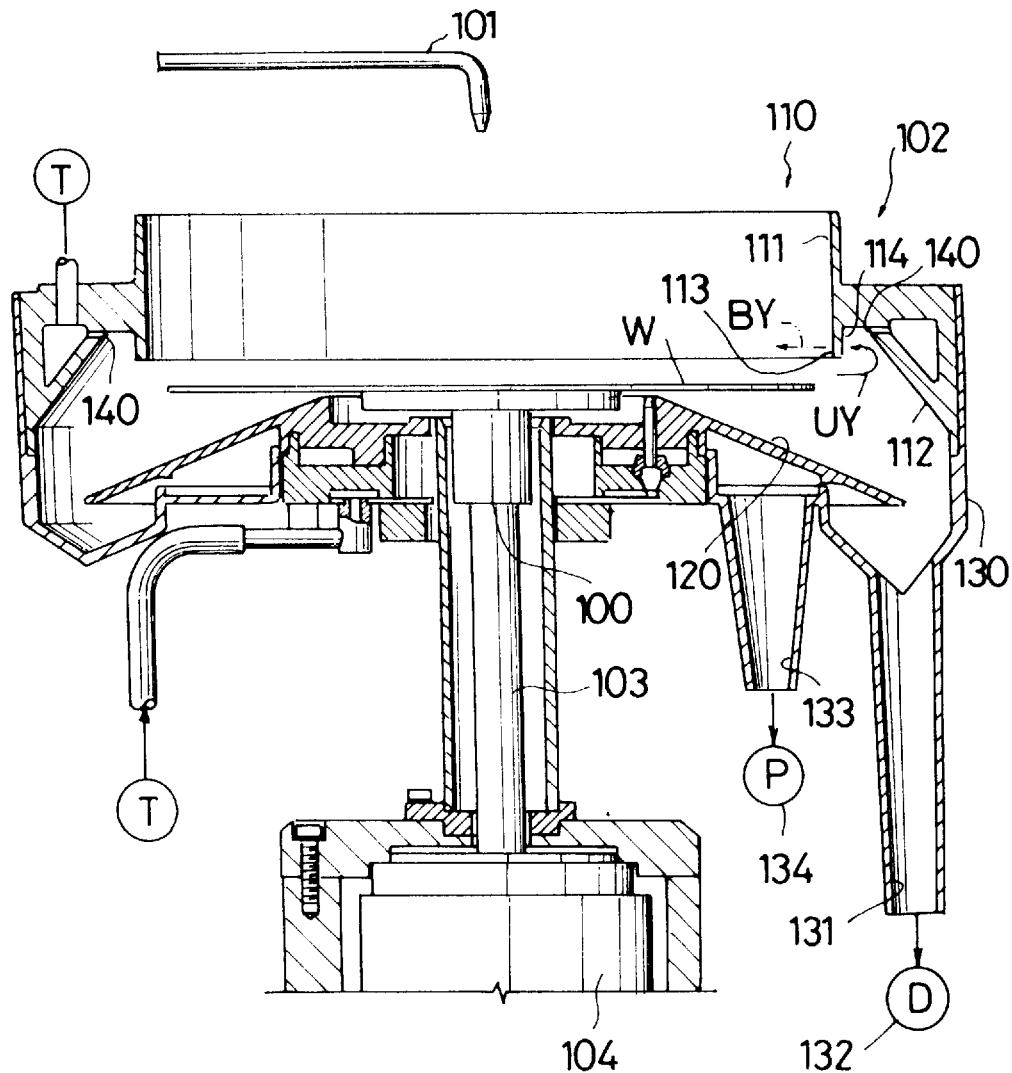
FIG. 1 is a view in vertical cross-section showing an overall construction of a conventional substrate spin treating apparatus.
FIG. 2 is an explanatory view showing a drawback of the conventional apparatus of FIG. 1.
Figure 3:
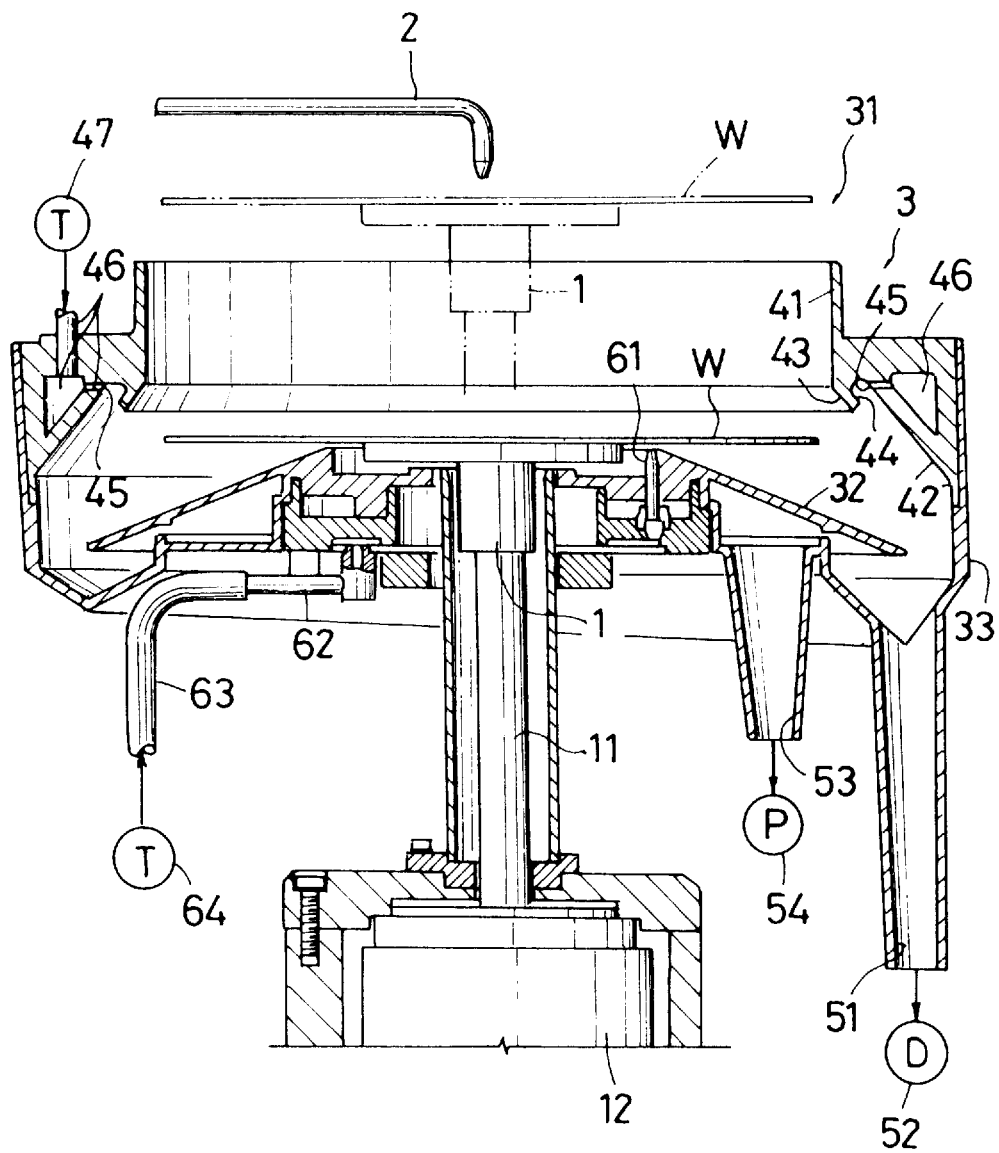
FIG. 3 is a view in vertical cross-section showing an overall construction of a substrate spin treating apparatus according to the present invention.
Figure 4:
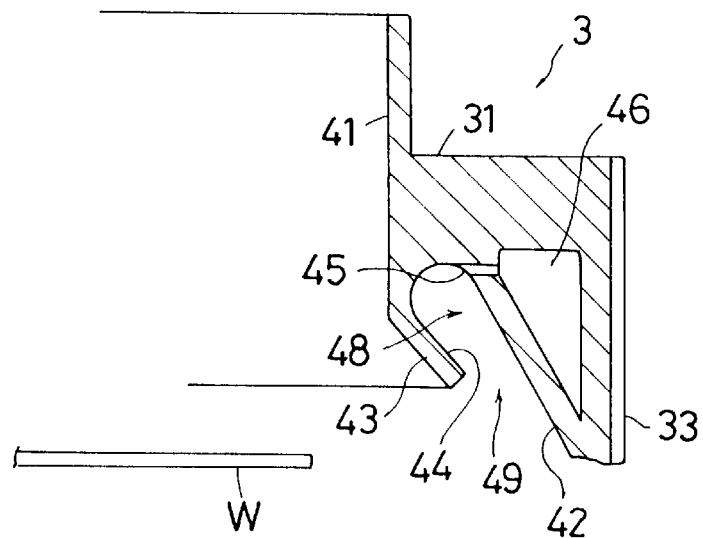
FIG. 4 is an enlarged view in vertical cross-section showing a principal portion of the apparatus according to the present invention.

As shown in FIGS. 3 and 4, an apparatus embodying this invention includes a spin chuck 1, a nozzle 2 and a scatter preventive cup 3.

The illustrated spin chuck 1 is the vacuum suction type for supporting a substrate or wafer W in horizontal posture. The spin chuck 1 is rotatable with a rotary shaft 11 driven by an electric motor 12 to spin the wafer W about a vertical axis. The spin chuck 1 is not limited to the vacuum suction type, but may be a mechanical type spin chuck, for example, which supports the wafer W at peripheral parts thereof from below and contacts edges of the wafer W to determine its horizontal position.

The spin chuck 1 is surrounded by a scatter preventive cup 3 for preventing scattering of a treating solution (which may be a photoresist solution, polyimide or SOG source in the case of a coating apparatus, and a developer in the case of a developing apparatus). A lift device, not shown, is provided to move the spin chuck 1 and scatter preventive cup 3 vertically relative to each other. Thus, the spin chuck 1 is raised above the scatter preventive cup 3 (as shown in two-dot-and-dash lines in FIG. 3) when a transport device, not shown, places a wafer W to be treated on the spin chuck 1 or receives a treated wafer W from the spin chuck 1.

The scatter preventive cup 3 includes an upper cup 31, a baffle disk 32 and a lower cup 33. The upper cup 31 is removably mounted on the lower cup 33.

The upper cup 31 has an opening 41 formed in an upper central region thereof for taking in downflows of air circulating through the entire apparatus, and an inclined surface 42 for downwardly guiding sprays of the treating solution and the like formed by a spin of the wafer W.

The upper cup 31 further includes an inner skirt 43 extending around an entire inner circumference thereof adjacent an upper end of the inclined surface 42. In this embodiment, the entire inner skirt 43 (in particular, a surface 44 of the inner skirt 43 opposed to the inclined surface 42) is bent away from the center of spin of the wafer W.

A plurality of delivery ports 45 for delivering a rinsing solution are arranged at predetermined intervals around the entire circumference of the upper cup 31 adjacent the upper end of the inclined surface 42. Each delivery port 45 is connected to a rinsing solution source 47 through a rinsing solution supply pipe 46 partly mounted in the upper cup 31. The rinsing solution supplied from the rinsing solution source 47 is applied through the delivery ports 45 to the inclined surface 42 and the surface of the inner skirt 43 opposed thereto, to remove the treating solution adhering to the surfaces 42 and 44.

The rinsing solution is delivered from each delivery port 45 in a direction tangent to a circle including the delivery port 45, for example. The number, positions and delivering directions of delivery ports 45 may be the same as in the conventional apparatus.

The baffle disk 32 straightens air currents entering through the opening 41 and flowing down around the edge of wafer W, and guides these air currents into the lower cup 33. The lower cup 33 has an exhaust duct 53 connected to a bottom position thereof. The exhaust duct 53 is connected to an exhaust pump 54 to exhaust the air currents from the lower cup 33. Sprays of the treating solution and the like guided downward by the inclined surface 42 of upper cup 31 are guided into the lower cup 33 as entrained on the air currents flowing down around the edge of wafer W.

The lower cup 33 further includes a waste drain 51 connected to a bottom position thereof. The waste drain 51 is connected to a waste tank 52 to collect used treating solution and the like.

The baffle disk 32 has back rinse nozzles 61 mounted therein for delivering a rinsing solution to the lower surface of wafer W to remove the treating solution having flowed around to the lower surface of wafer W and mist adhering thereto. The back rinse nozzles 61 receive the rinsing solution from a rinsing solution source 64 through a pipe coupling 62 and a supply pipe 63.

The nozzle 2 is disposed above the opening 41 of scatter preventive cup 3 and over the spin center of wafer W for supplying the treating solution such as a photoresist solution, polyimide, SOG (Spin-On-Glass) source.

With the apparatus having the above construction, a wafer W is supported in horizontal a posture on the spin chuck 1, the treating solution is supplied from the nozzle 2 to the wafer W, and the wafer W is spun about the vertical axis. In this way, the treating solution is applied to form a coating or puddle on the surface of wafer W to effect a predetermined substrate treatment (e.g. coating or development).

The inventors of the present invention carried out an experiment in a continuous photoresist application using the apparatus having the construction described above, to check on adhesion of the photoresist solution to and adjacent the inner skirt 43. The experiment showed excellent results. That is, the photoresist solution having accumulated did not hang like icicles from the lower end of the inner skirt 43. Moreover, the photoresist solution adhered in a reduced amount to the surface 44 of the inner skirt 43 opposed to the inclined surface 42.

Figure 5:
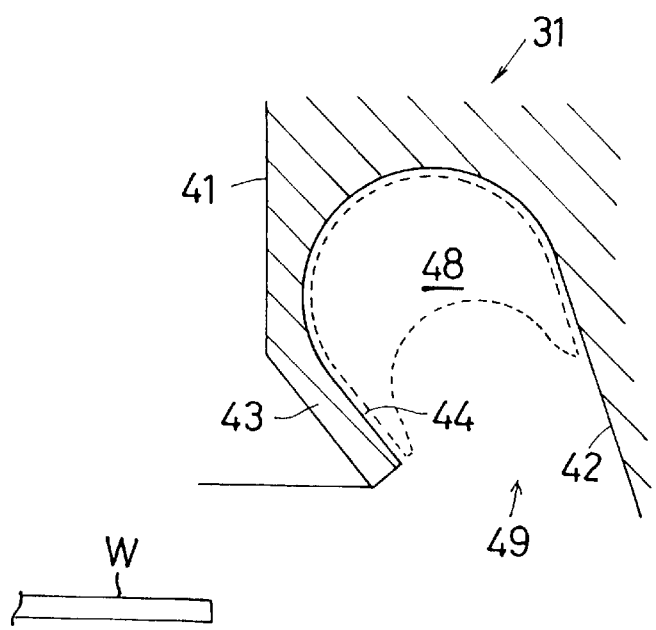
FIG. 5 is a view showing a simulation of gas currents in a space between a surface of an inner skirt and an inclined surface.

Further, the inventors tested, by simulation, air currents occurring adjacent the upper ends of the inner skirt 43 and inclined surface 42 during photoresist application. It was found that reduced air currents occurred in a region enclosed the dotted line shown in FIG. 5. It is believed that, during photoresist application, air currents containing fine particles of the photoresist solution and the like are restrained from entering a space 48 between the inclined surface 42 and the surface 44 of the inner skirt 43 opposed thereto. This must have resulted in the reduced adhesion of the photoresist solution to surface 44 of the inner skirt 43.

Figure 6:
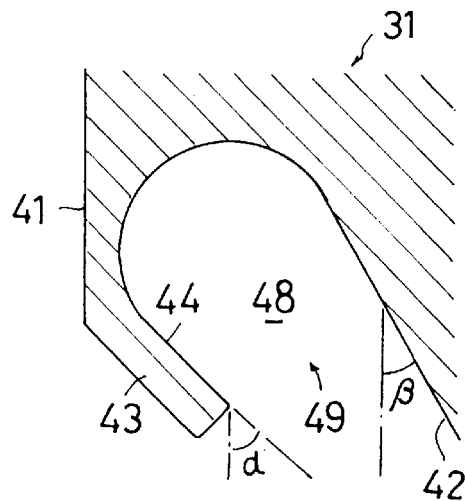
FIG. 6 is a view showing a relationship between a turnback angle of the surface of the skirt side and an inclination angle of the inclined surface.

Similar experiments and simulations have been conducted on other configurations of inner skirt 43. Compared with the conventional apparatus with the inner skirt 43 extending straight downward, the construction according to the present invention provides a restricted opening 49 to the space 48 between the inclined surface 42 and the surface 44 of the inner skirt 43 opposed thereto, and forms a pouch-like sectional shape. That is, the surface 44 of the inner skirt 43 opposed to the inclined surface 42 is bent away from the spin center of wafer W. Based on the results of all experiments and simulations, the inventors have reached a conclusion that the construction according to this invention effectively restrains entry to the space 48 of the air currents containing fine particles of the photoresist solution and the like. It has also been concluded that the entry of air currents to the space 48 is restrained with increased assurance where, as shown in FIG. 6, the opening 49 to the space 48 is restricted such that turnback angle α formed between a vertical line and the surface (turnback surface) 44 of the inner skirt 43 opposed to the inclined surface 42 is larger than or equal to inclination angle β between a vertical line and the inclined surface 42 ($\alpha \geq \beta$). The above turnback angle α may be larger than zero degree and smaller than β.

Further, the inventors experimented with cup rinsing using the apparatus embodying the present invention and having the same number, positions and delivering directions of delivery ports 45 as the conventional apparatus, and with the same conditions regarding the quantity and time of the rinsing solution delivered in the conventional apparatus. It was found that the rinsing solution was distributed over the inclined surface 42 as effectively as in the conventional apparatus. In the apparatus embodying the present invention, the rinsing solution spread uniformly over the surface 44 of the inner skirt 43 opposed to the inclined surface 42. The problem occurring with the conventional apparatus of the rinsing solution flowing over certain portions but not the other portions was absent from the apparatus embodying the present invention. It is believed that the rinsing solution flows along the turnback of the surface 44 of the inner skirt 43 opposed to the inclined surface 42 to spread uniformly over that surface 44.

Figure 7:
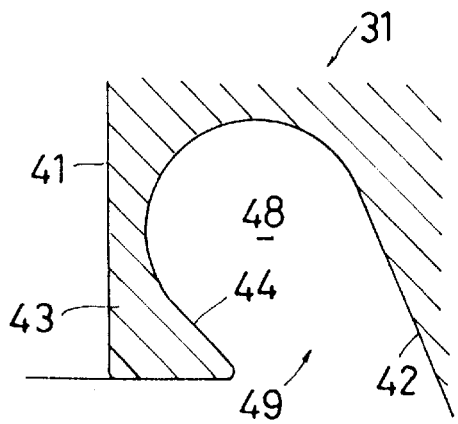
FIG. 7 is an enlarged view in vertical cross-section showing a modified construction adjacent the inner skirt.

In the above embodiment, the entire inner skirt 43 is bent back, but the present invention is not limited to such configuration. As shown in FIG. 7, for example, only the surface 44 of the inner skirt 43 opposed to the inclined surface 42 may be bent away from the spin center of wafer W.

Figure 8:
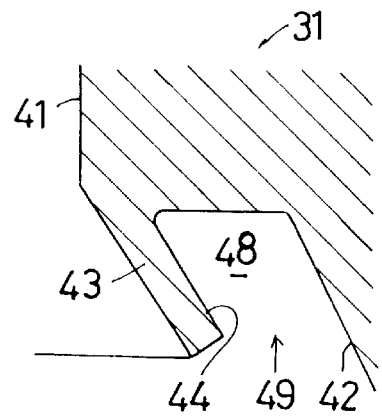
FIG. 8 is an enlarged view in vertical cross-section showing another modified construction adjacent the inner skirt.

The space 48 between the inclined surface 42 and the surface 44 of the inner skirt 43 opposed thereto may have a curved ceiling as shown in FIG. 7, or a planar ceiling as shown in FIG. 8.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate spin treating apparatus for treating a substrate by supplying a treating solution to the substrate while the substrate is supported in a horizontal posture and spun about a vertical axis, said apparatus comprising:

a spin chuck for supporting said substrate in a horizontal posture and spinning said substrate about said vertical axis;

a nozzle for supplying said treating solution to said substrate supported by said spin chuck from a predetermined position above said substrate; and a scatter preventive cup disposed to surround said substrate on said spin chuck and having an inclined surface extending around an entire inner circumference of said cup for downwardly guiding a spray of said treating solution and the like formed by spinning said substrate;

said scatter preventive cup includes an inner skirt extending around an entire circumference adjacent an upper end of said inclined surface, said inner skirt having a surface opposed to said inclined surface and bent away from a spin center of said substrate whereby said treating solution is suppressed from adhering to said surface of said inner skirt.

2. A substrate spin treating apparatus as defined in claim 1, wherein said inner skirt in its entirety is bent away from said spin center.

3. A substrate spin treating apparatus as defined in claim 1, wherein a turnback angle formed between a vertical line and said surface of said inner skirt opposed to said inclined surface is at least as large as an inclination angle between a vertical line and said inclined surface.

4. A substrate spin treating apparatus as defined in claim 1, wherein said inclined surface and said surface of said inner skirt opposed thereto define a space having a curved ceiling therebetween.

5. A substrate spin treating apparatus as defined in claim 1, wherein said inclined surface and said surface of said inner skirt opposed thereto define a space having a planar ceiling therebetween.

6. A substrate spin treating apparatus as defined in claim 1, further comprising rinsing solution delivery means for delivering a rinsing solution from adjacent said upper end of said inclined surface.

7. A substrate spin treating apparatus as defined in claim 6, wherein said rinsing solution delivery means includes:

a rinsing solution source for supplying said rinsing solution;

a plurality of rinsing solution delivery ports arranged adjacent said upper end of said inclined surface; and a rinsing solution supply pipe extending between said rinsing solution source and said rinsing solution delivery ports.

8. A substrate spin treating apparatus as defined in claim 1, wherein said scatter preventive cup includes:

an upper cup defining said inner skirt and said inclined surface;

a lower cup having, in bottom positions thereof, an exhaust duct connected to an exhaust pump, and a waste drain connected to a waste tank; and a baffle disk disposed below edges of said substrate and straightening gas currents flowing from said upper cup down around the edges of said substrate, and guiding said gas currents into said lower cup.

9. A substrate spin treating apparatus as defined in claim 8, wherein said upper cup has an opening in an upper central region thereof, said inner skirt being formed in a lower portion of said opening, and said inclined surface being continuous with said surface of said inner skirt bent away from said spin center.

10. A substrate spin treating apparatus as defined in claim 8, wherein said upper cup is removably mounted on said lower cup.

11. A substrate spin treating apparatus as defined in claim 1, wherein said nozzle supplies a photoresist solution.

12. A substrate spin treating apparatus as defined in claim 1, wherein said nozzle supplies a polyimide.

13. A substrate spin treating apparatus as defined in claim 1, wherein said nozzle supplying a SOG (Spin-On-Glass) source.

14. A substrate spin treating apparatus as defined in claim 1, wherein said nozzle supplies a developer.

\* \* \* \* \*